United States Patent [19]
Molvik et al.

[11] Patent Number: 5,824,602
[45] Date of Patent: Oct. 20, 1998

[54] HELICON WAVE EXCITATION TO PRODUCE ENERGETIC ELECTRONS FOR MANUFACTURING SEMICONDUCTORS

[75] Inventors: Arthur W. Molvik, Livermore; Albert R. Ellingboe, Fremont, both of Calif.

[73] Assignee: The United States of America as represented by the United States Department of Energy, Washington, D.C.

[21] Appl. No.: 734,219

[22] Filed: Oct. 21, 1996

[51] Int. Cl.$^6$ .............................. H01L 21/00; C23C 16/00
[52] U.S. Cl. ............................ 438/714; 438/732; 216/67; 216/68; 156/345; 118/723 AN; 118/723 MA; 118/723 MR; 118/723 I
[58] Field of Search ...................................... 438/712, 719, 438/714, 722, 723, 724, 732; 204/192.11, 192.22, 192.23, 192.34, 192.37, 298.37; 216/67, 68, 79, 80; 156/345; 118/723 R, 723 MA, 723 MR, 723 AN, 723 I, 723 IR

[56] References Cited

U.S. PATENT DOCUMENTS

| | | | |
|---|---|---|---|
| 4,976,843 | 12/1990 | Ward et al. | 204/298.36 |
| 4,990,229 | 2/1991 | Campbell et al. | 204/298.06 |
| 5,122,251 | 6/1992 | Campbell et al. | 204/298.06 |
| 5,399,830 | 3/1995 | Maruyama | 219/121.43 |
| 5,447,614 | 9/1995 | Hamamura et al. | 204/192.33 |
| 5,585,541 | 12/1996 | Miyake et al. | 204/298 |
| 5,662,819 | 9/1997 | Kadomura | 438/711 |

OTHER PUBLICATIONS

A. R. Ellingboe et al., "Electron Beam Pulses Produced by Helicon–Excitation", Physics Plasmas 2 (6), Jun. 1995, pp. 1807–1809.

A. R. Ellingboe et al., "Capacitive, Inductive and Helicon–Wave Modes of Operation of a Helicon Plasma Source", Physics Plasmas 3 (7), Jul. 1996, pp. 2797–2804.

J. Ding et al., "Etching Rate Characterization of SiO2 and Si Using Ion Energy Flux and Atomic Fluorine in a CF4/02/Ar Electron Cyclotron Resonance Plasma", J. Vac. Sci. Technol. A 11(4), Jul./Aug. 1993, pp. 1283–1288.

M. E. Barone et al., "Chemical and Physical Sputtering of Fluorinated Silicon", J. Appl. Phys. 77 (3), 1 Feb. 1995, pp. 1263–1274.

O. A. Popov, "High Density Plasma Sources: Design, Physics and Performance", Noyes Publications, 1995, pp. 1–75.

F. F.Chen et al., "Electron Acceleration in Helicon Sources", Plasma Physics and Controlled Fusion vol. 34, No. 4, 1992, pp. 635–640.

*Primary Examiner*—R. Bruce Breneman
*Assistant Examiner*—Luz Alejandro
*Attorney, Agent, or Firm*—Gary R. Drew; William C. Daubenspeck; William R. Moser

[57] ABSTRACT

A helicon plasma source is controlled by varying the axial magnetic field or rf power controlling the formation of the helicon wave. An energetic electron current is carried on the wave when the magnetic field is 90 G; but there is minimal energetic electron current when the magnetic field is 100 G in one particular plasma source. Similar performance can be expected from other helicon sources by properly adjusting the magnetic field and power to the particular geometry. This control for adjusting the production of energetic electrons can be used in the semiconductor and thin-film manufacture process. By applying energetic electrons to the insulator layer, such as silicon oxide, etching ions are attracted to the insulator layer and bombard the insulator layer at higher energy than areas that have not accumulated the energetic electrons. Thus, silicon and metal layers, which can neutralize the energetic electron currents will etch at a slower or non-existent rate. This procedure is especially advantageous in the multilayer semiconductor manufacturing because trenches can be formed that are in the range of 0.18–0.35 mm or less.

30 Claims, 7 Drawing Sheets

HELICON WAVE EXCITATION TO PRODUCE ENERGETIC ELECTRONS FOR MANUFACTURING SEMICONDUCTORS

STATEMENT AS TO RIGHTS OF INVENTION

The United States Government has rights in this invention pursuant to Contract No. W-7405-ENG-48 between the United States Department of Energy and the University of California for the operation of the Lawrence Livermore National Laboratory.

BACKGROUND OF THE INVENTION

1. Field of the Invention

This invention relates to improvements in the control and applications of helicon plasma sources. More particularly, this invention relates to controlling the production of energetic electrons in helicon plasma sources by changing the magnetic field strength. This control of the production of energetic electrons has a vital application in oxide etching in future generations of semiconductor manufacturing.

2. Description of the Related Art

Figure 1:
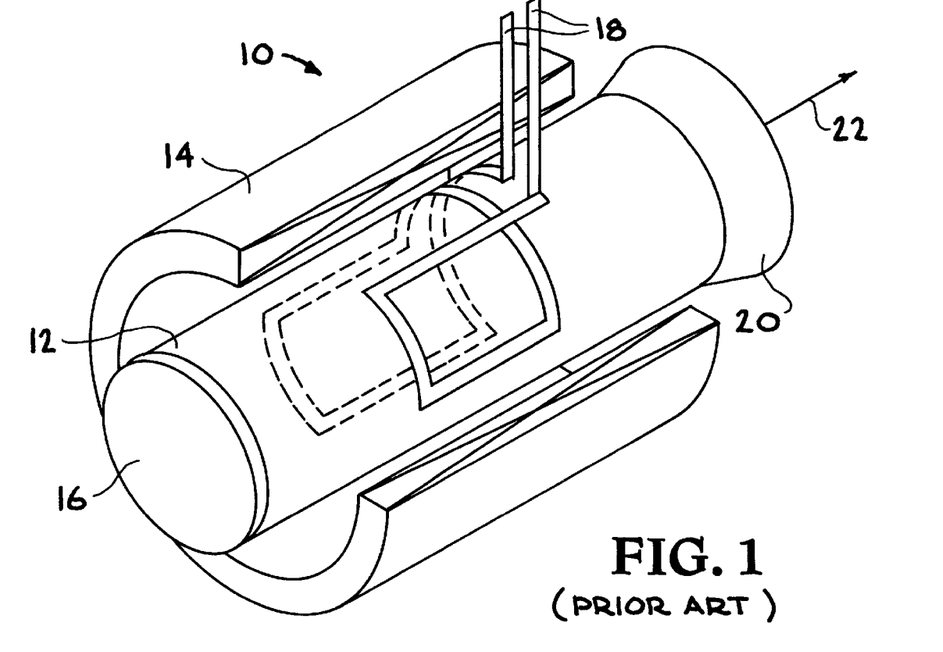
FIG. 1 is a helicon plasma source in the prior art.

Helicon plasma sources are typically operated using a plasma gas such as argon or reactive compounds containing such elements as fluorine, chlorine, or bromine. Although there are many designs, a typical helicon plasma source 10 is shown in FIG. 1. However, the application of this invention is not limited to this particular design. A tube 12, which may be Pyrex or another insulating material, holds the plasma to be excited and is capped at one end; the plate may be a conductor as shown 16, or an insulator such as Pyrex. At the other end of the tube 12 is attached a drift chamber 20, which will allow the helicon wave 22 to expand. As an example, the tube 12 may have an inner diameter of 0.18 meters and a length of approximately 0.5 meters. An antenna 18, this example has a double-saddle coil, is positioned on the exterior of the tube 12. The matching network (not shown) feeds the antenna, for example, at a frequency of 13.56 MHz and 2 kW rf power. A coaxial solenoidal winding 14 produces a magnetic field ranging from 100–300 G. Plasmas are produced with approximately 30 sccm argon continuously flowing through the system resulting in a neutral pressure of approximately 0.4 Pa. It has been observed that negative potentials of as much as −200 V can develop on the end walls of a helicon source. The helicon wave 22 is produced by radio-frequency power from the antenna interacting with a plasma in a magnetic field of an appropriate strength. Practical uses for the helicon plasma source have been limited by the greater complexity and lack of perceived advantages over inductively coupled plasma sources.

Figure 2:
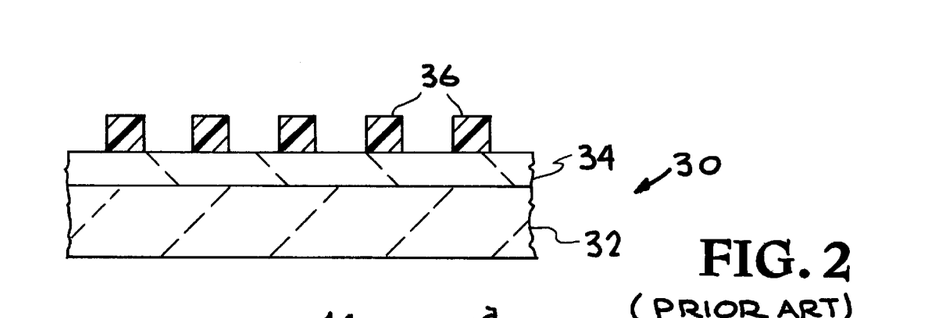
FIG. 2 is a semiconductor device prepared for the etching process in the prior art.

In the semiconductor industry, oxide etching is currently the most unsatisfactory process for the next generation of etching with feature sizes of less than 0.35 $\mu$m. Referring to FIG. 2, a semiconductor 30 before etching is shown. The silicon substrate 32, which is usually doped, has a silicon oxide layer 34 and a patterned photo-resist layer 36 for the etching process. The semiconductor is then exposed to an etching gas which may contain fluorine, chlorine, or bromine.

Figure 3:
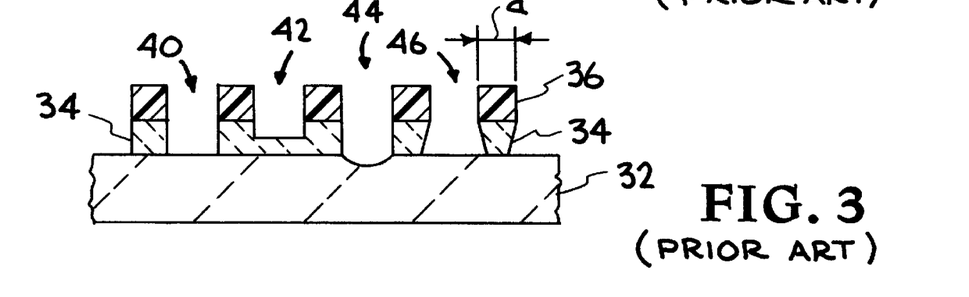
FIG. 3 is a semiconductor device after etching by the prior art method.

As shown in FIG. 3, the etched semiconductor can have several defects after the etching process is complete. Compared to section 40, which is properly etched, that is, all of the silicon oxide 34 has been removed that was not covered by photo-resist, there is still oxide remaining in section 42. Thus, the metal layer (not shown), which is added in a subsequent step, will not be in contact with the doped silicon substrate 32.

Section 44 of FIG. 3 illustrates another problem. The silicon substrate 32 has been etched. Thus, the thin doped layer located near the surface of the substrate 32 may have been completely removed. In proper etching, manufacturers carefully control the concentration of etching gas so that the silicon oxide layer etches at a much faster rate (perhaps 10 times faster) than the silicon substrate. However, there still may be some undesirable etching of the substrate.

Another problem shown in FIG. 3 is the eroding of the walls of the silicon oxide layer, such that undercutting of the photo-resist layer occurs, as shown in Section 46. Undercutting limits the closeness at which different circuits and parts thereof can be placed.

When any of these defects occur, the defective semiconductor section cannot be used. Sometimes the entire semiconductor chip must be discarded. This can be very expensive.

Furthermore, etching oxide layers in integrated circuits is one of the necessary steps in producing multilayer integrated circuits because of the need to form electrical connections between layers. Oxide etching is also referred to as contact/via etching because its purpose is to allow electrical connections between the multiple layers of an integrated circuit. Research has shown that etching of silicon and metal can be performed for feature sizes in the range of 0.18–0.35 $\mu$m. However, silicon oxide etch continues to be unsatisfactory, because of poor selectivity and difficulty of etching deep contact holes and vias. In conclusion, multilayer integrated circuits, which are the standard in high performance applications such as computer chips, are limited by the silicon oxide etching step because of the silicon oxide etching problems existing for feature sizes less than 0.35 $\mu$m.

SUMMARY OF THE INVENTION

An object of the present invention is to control the production of energetic electrons in helicon plasma sources by controlling the strength of magnetic fields and/or radio frequency power.

Another object of the present invention is to perform oxide etching in the semiconductor industry that has small feature sizes in the range of 0.18–0.35 $\mu$m or even less. A more selective etch of oxide relative to silicon or metal can be performed because energetic electrons will charge an oxide surface negatively which will accelerate positive etchant ions to higher energy and effectiveness when incident on the silicon oxide. This will selectively increase the etch rate on oxide areas and reduce the etch rate on non-oxide areas.

A further object of the present invention is to fabricate multilayer semiconductors using the silicon oxide etching method of this invention. Furthermore, the capability of performing multiple processes with the same tool may increase productivity by reducing the number of times a wafer must be transferred between tools. Thus, the helicon plasma source can be used to solve some of the manufacturing problems that the semiconductor industry presently has.

Another object of the present invention is to perform a more controlled and selective etch of thin film device. By controlling the production of energetic electrons, a manufacturer can accurately control the etching of insulators, such as oxides, on thin film devices. This technique could be useful in the flat panel display technology.

BRIEF DESCRIPTION OF THE DRAWINGS

For a better understanding of the invention and further features thereof, reference is made to the following detailed description of the invention to be read in connection with the accompanying drawings, wherein.

DETAILED DESCRIPTION OF THE PREFERRED EMBODIMENTS

While this invention is described in some detail herein, with specific reference to an illustrated embodiment, it is to be understood that there is no intent to be limited to that embodiment. On the contrary, the aim is to cover all modifications, alternatives and equivalents falling within the spirit and scope of the invention as defined by the claims. Specifically, the invention is applicable to any situation where control of the production of energetic electrons is advantageous. Further, the manufacture of semiconductors during the oxide etch stage is enhanced by controlling the number and velocity of energetic electrons. The etching of any insulator on thin film devices could benefit from this invention.

The first preferred embodiment will be described with reference to FIG. 4. A helicon plasma source 50 of the present invention is shown. Many of the components are the same as described previously in the prior art. An antenna 18 is formed around a Pyrex tube 12 with an end plate 16. The coaxial solenoidal winding 14 is wrapped around the tube 12 to form magnetic fields within the tube 12.

The prior art simply applied a non-changing magnetic field to the plasma chamber to obtain a high amplitude helicon wave emanating from the tube. In fact, the prior art usually formed a magnetic field with a magnitude in the range of 100–1000 G. FIG. 5a represents a graph showing energetic electron current being controlled by varying the axial magnetic field strength. It is clear that the energetic electron current density is almost zero when the magnetic field is greater than 100 G. Referring to FIG. 5b, the semi-logarithmic plot shows peaks of energetic electron current beyond 100 G, but that these peaks are smaller by a factor of 5 or more than the peaks below 100 G. When the magnetic field is adjusted to the range of 50–90 G, the current density increases dramatically. Thus, one key to forming and controlling the number of energetic electrons riding on the helicon wave is by controlling the magnetic field applied to the plasma. In FIG. 4, a magnetic field controller 52 is attached to the coaxial solenoidal windings to control the magnetic field within the plasma chamber.

Energetic electrons with velocities corresponding to a few 10's of eV have been observed spectroscopically from pulses of argon visible light line radiation at the rf frequency (13.56 MHz) that drives the helicon plasma source. (See "Electron Beam Pulses Produced by Helicon-Wave Excitation" by A. R. Ellingboe, et al., Physics of Plasmas 2, 1807 (1995), which is incorporated herein by reference.) As shown in FIG. 5a, the energetic electron increases to a peak of 7 mA/cm$^2$ at 35 G, to a larger peak of 18 mA/cm$^2$ at 90 G axial magnetic field under the antenna, then decreases abruptly to 1 mA/cm$^2$ at 100 G.

Figure 6A:
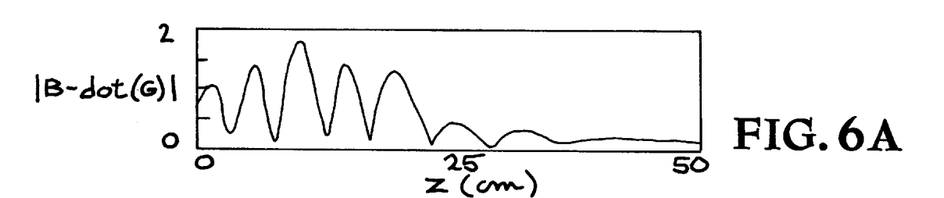
FIG. 6a is a graph showing rf magnetic field strength relative to the axial position within the plasma tube when the electron axial energy resonant with the wave is 5eV and the magnetic field is 36 G.
Figure 6B:
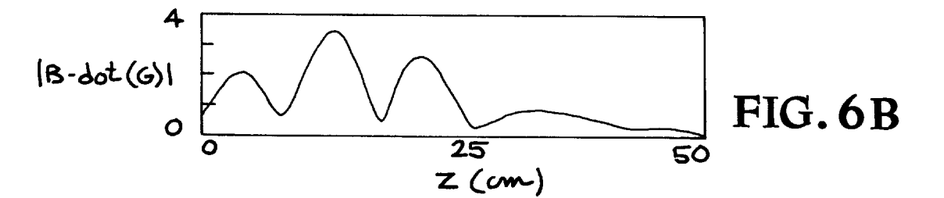
FIG. 6b is a graph showing rf magnetic field strength relative to the axial position within the plasma tube when the electron axial energy resonant with the wave is 18 eV and the magnetic field is 81 G.
Figure 6C:
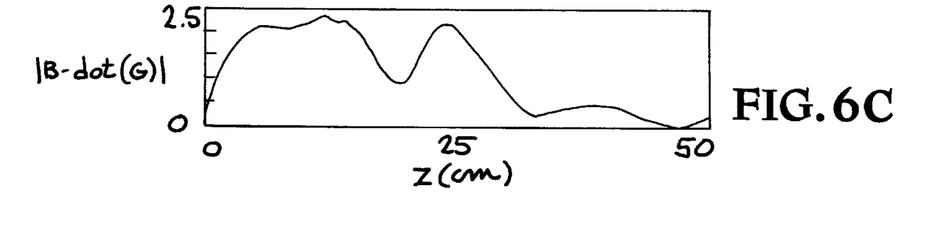
FIG. 6c is a graph showing rf magnetic field strength relative to the axial position within the plasma tube when the electron axial energy resonant with the wave is 50 eV and the magnetic field is at 117 G.

FIGS. 6a–6c show graphs of the rf magnetic field strength relative to the axial position under the antenna and within the tube. The phase velocity is equal to the product of the frequency and the measured axial wavelength. In FIG. 6a, the computed phase velocity corresponds to electron axial energy of 5 eV at a magnetic field of 36 G. In FIG. 6b, the computed phase velocity corresponds to electron axial energy of 18 eV at a magnetic field of 81 G. In FIG. 6c, the computed phase velocity corresponds to electron axial energy of 50 eV at a magnetic field of 117 G. These graphs show quantized jump changes in the axial wavelength as dc magnetic field varies. These axial scans, made with an 18 channel magnetic probe, show that the number of axial modes varied over this range of magnetic fields at which the electron energy analyzer observed rapid changes in the energetic electron current, that is, the axial wavelength underwent quantum changes.

For a typical electron temperature of 2–4 eV, collisions will probably prevent heating a significant tail of the distribution function at 5 eV where the EEDF (Electron Energy Distribution Function) has only dropped to approximately 5% of the peak. At 18 eV the EEDF is down to approximately 0.1 percent of the peak so pulling out a tail can be reasonably expected and electron energy analyzer measurements show a tail of about this energy. At 50 eV it is unlikely that any electrons are sufficiently close to this energy to be trapped by the wave.

The exact values of magnetic field, shown in FIGS. 5a–5b and 6a–6c, depend on the size of the source tube 12 (shown in FIG. 4) and on the plasma density. These can be related approximately by the following equation:

$$\omega/k = 2 \times 10^{19}(B_0/(a\, n_0)) \quad (1)$$

where ω is the angular frequency (2πf); k is the wave number (2π/λ); $B_0$ is the axial magnetic field in Gauss; a is the plasma radius, that is the radius of cylinder 12 in FIG. 4; and $n_0$ is the electron density in $cm^{-3}$. For a given geometry the energetic electron production can be optimized by either measuring the electron current directly with an electron energy analyzer and maximizing the current, or by measuring the axial rf magnetic fields and adjusting the magnetic field until the product of the axial wavelength times the rf frequency equals a phase velocity of about 2 to $3 \times 10^8$ cm/s.

Figure 4:
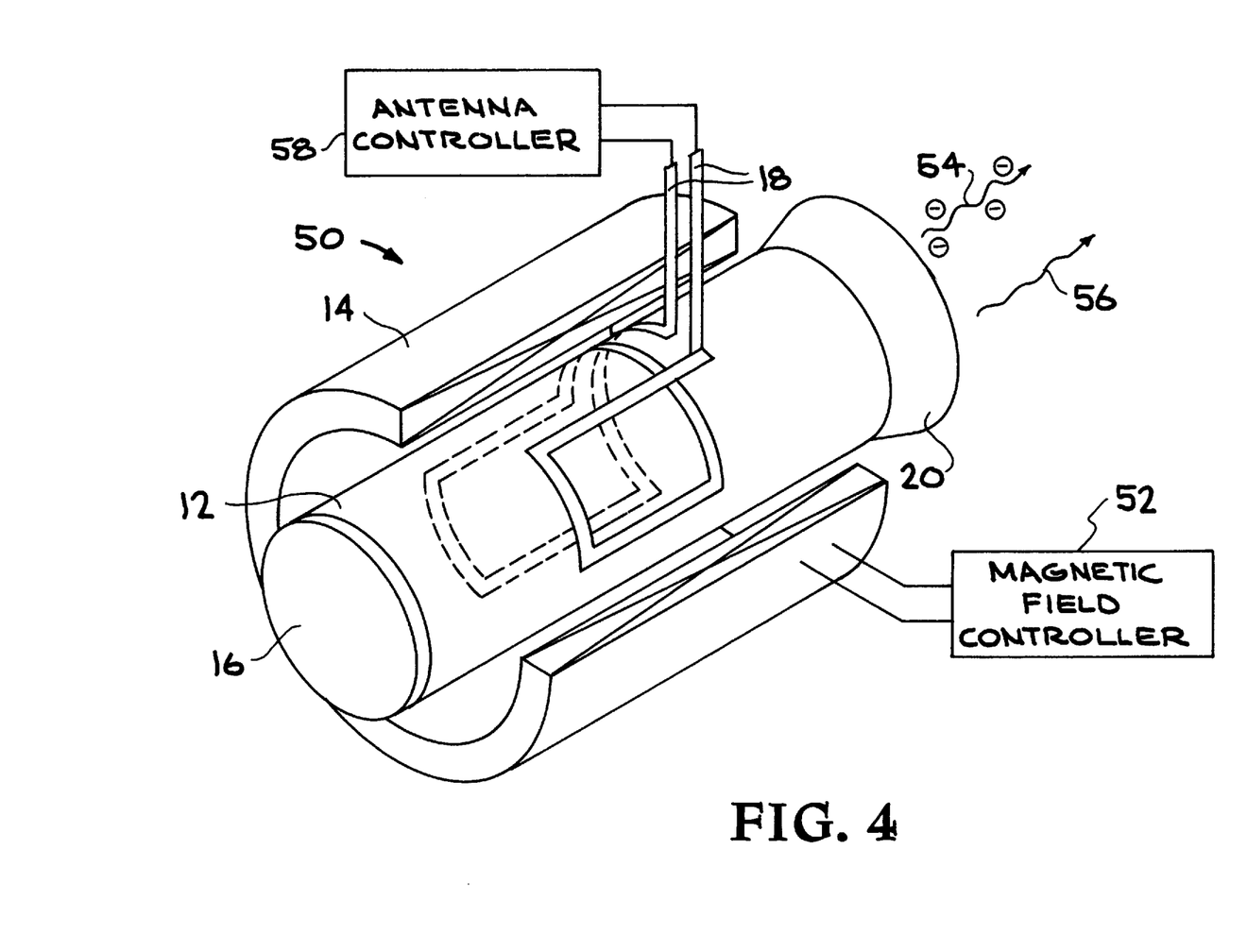
FIG. 4 is a diagram of the helicon plasma source of the present invention.
Figure 5A:
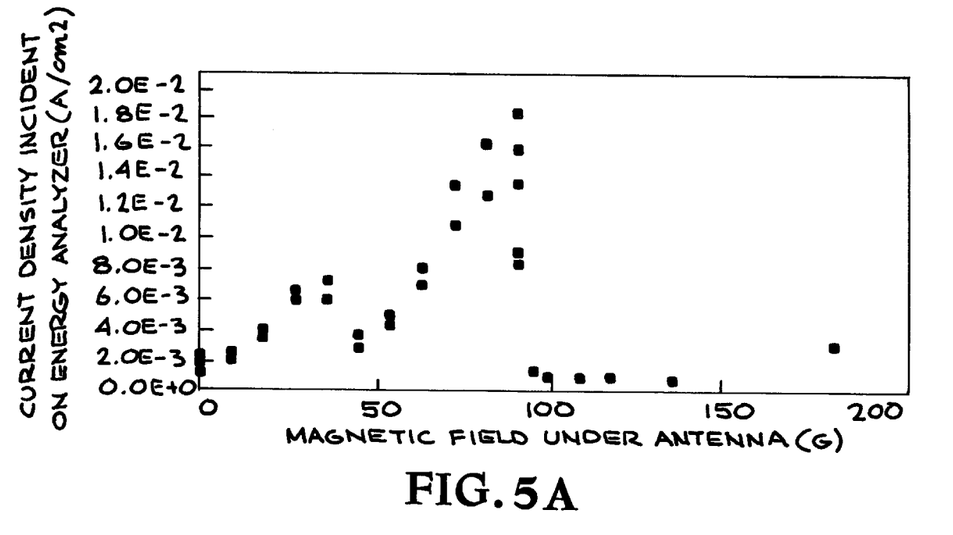
FIG. 5a is a graph showing energetic electron current being controlled by varying the axial magnetic field strength.
Figure 5B:
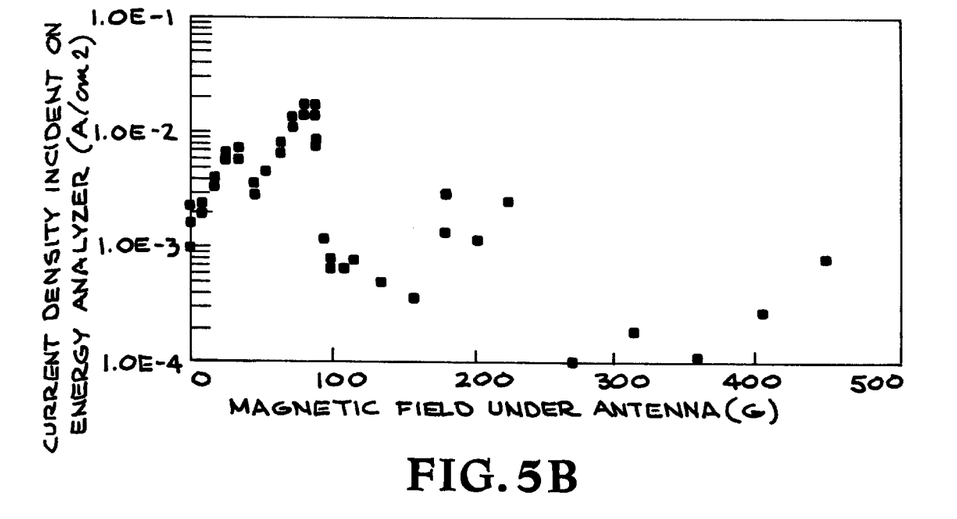
FIG. 5b is a semi-logarithmic graph showing energetic electron current being controlled by varying the axial magnetic field strength.
Figure 5C:
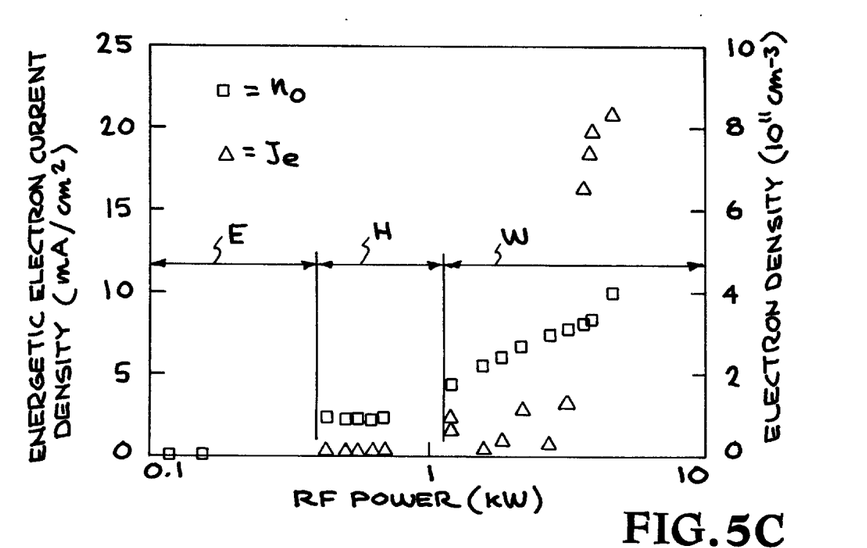
FIG. 5c is a graph showing energetic electron current being controlled by varying the rf power supplied to the antenna.

When the magnetic field is properly adjusted for optimum energetic electron production, the energetic electron current can also be turned off by reducing the rf power by using an antenna controller 58 as shown in FIG. 4. In FIG. 5c, a graph shows that when the magnetic field is held constant and the rf power is adjusted, the warm electron current $J_e$, becomes significant above the second density jump. The helicon plasma source operates in three modes (see FIG. 5c): E-capacitive mode; H-inductive mode; and W-helicon wave mode. (See "Capacitive, Inductive and Helicon-Wave Modes of Operation of a Helicon Plasma Source", by A. R. Ellingboe et al., Physics of Plasma V3 n7 (July 1996), pgs. 2797–2804, which is incorporated herein by reference.) Although the electron density $n_0$ maintains a gradual increase in energetic electron current density in this third mode, the warm electron current $J_e$ has a significant increase with only a little change in the rf power. This provides an additional means of control. It also points out that the rf power must be sufficiently high in order to determine the optimum magnetic field for energetic electron production.

In conclusion, helicon plasma sources can produce energetic electrons in sufficient quantity to be used for many uses such as, for example, etching oxides and controlling the plasma chemistry. By varying the magnetic field from 80–100 G, in the example shown here, one can control the energetic electron current carried by the helicon wave. For example, when the magnetic field is at 80 G, there will be energetic electrons present on the helicon wave 54 as shown in FIG. 4. When the magnetic field is modified to 100 G, there are barely any energetic electrons surfing on the helicon wave 56. The strength of the magnetic field needed to perform this function may be different when using other types of plasma or when the dimensions of the source tube are changed. However, the production of energetic electrons can be turned on and off very quickly and easily by using a magnetic field controller 52 as shown in FIG. 4.

The second preferred embodiment of the present invention capitalizes on the ability of the semiconductor or thin-film device manufacturer to control the energetic electrons being produced by the helicon plasma source. Thus, the production of energetic electrons can be turned on and off to switch between high-density plasma insulator etching, for example, an oxide etching, with the energetic electrons and simple metal or silicon etching without energetic electrons.

Figure 7:
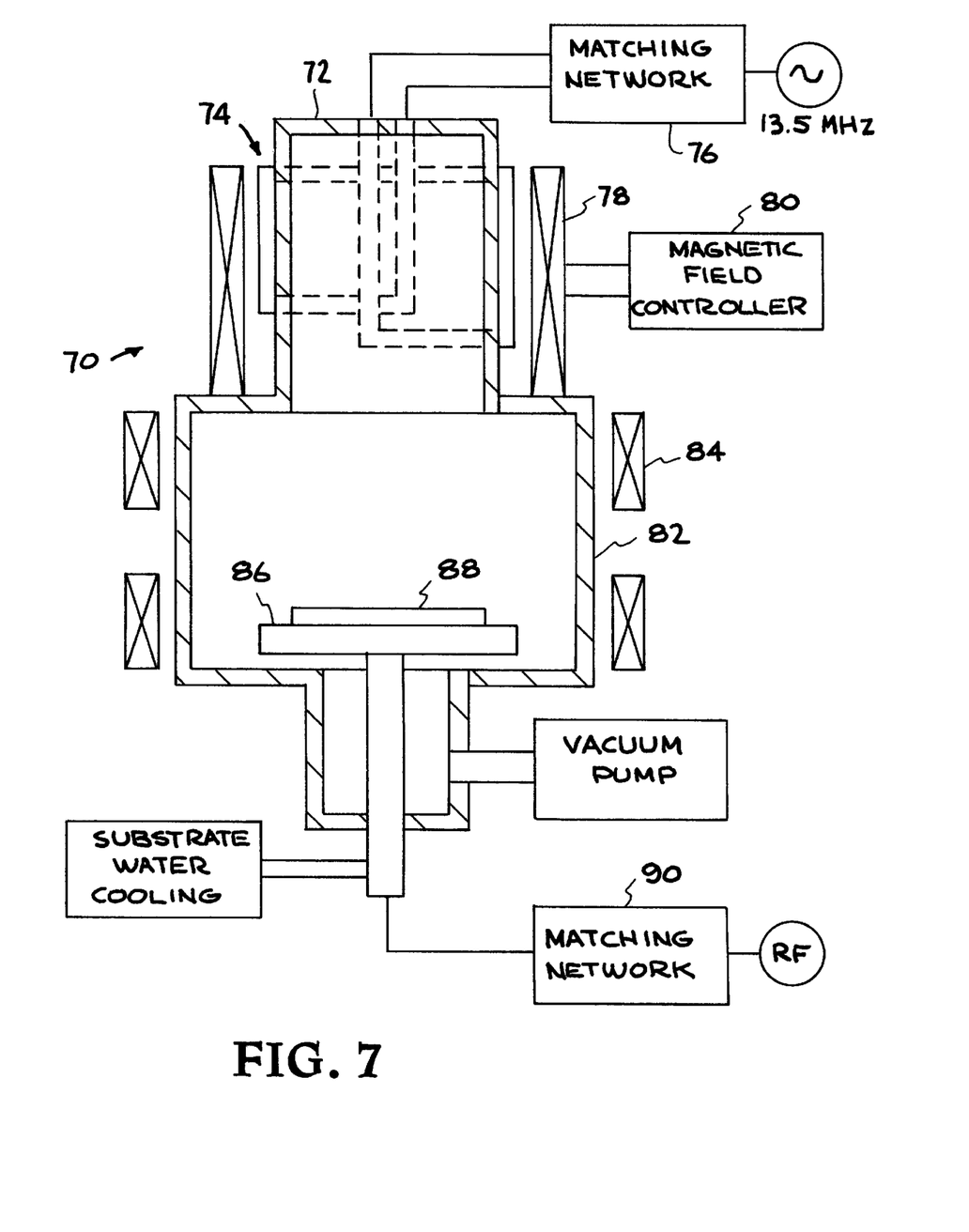
FIG. 7 is a diagram of an assembly for manufacturing semiconductors by using a helicon plasma source.

Referring to FIG. 7, the semiconductor 88 or any thin film device to be etched is placed in an assembly 70. The helicon plasma source 72 in this assembly 70 has, for example, the same components described above, that is, an antenna 74, a matching network 76 to supply the 2 kW rf power at a frequency of 13.56 MHz; coaxial solenoidal windings 78 to produce magnetic fields; and a magnetic field controller 80. The assembly 70 also has coaxial solenoidal windings 84 around the chamber 82 portion to further control the wavelength and phase velocity of the helicon waves emanating from the helicon plasma source 72. The semiconductor wafer 88 is placed on a table 86. The table can optionally have an rf bias, supplied by matching network 90, and separately adjusted in power and phase from the antenna rf feed.

In the prior art, etching plasma gas would be injected into the chamber 82 to remove the exposed silicon oxide on the semiconductor 88. A recent molecular dynamics model of etching showed that ions bombard the surface of the silicon oxide with sufficient energy to produce dangling bonds, but do not directly remove the atoms from the surface. (See "Chemical and Physical Sputtering of Fluorinated Silicon" by M. E. Barone and D. B. Graves, J.Appl.Phys. 77 (3), pgs. 1263–1273). The atoms are removed by reactions with fluorine gas that produces volatile products. Thus, the ions require a threshold energy to produce the dangling bonds in this model. Etching is found by others to be due to a combination of ions bombarding a surface and producing dangling bonds that subsequently react with atomic neutrals (typically F, Cl or Br) yielding a volatile product which removes the atoms from the surface.

In order to maintain the incident electron current to be equal to the ion current (as it must be in steady-state operation when potentials on surfaces are no longer changing), a charge voltage on the oxide surfaces will be created that will repel all but the most energetic electrons. This results in voltage potentials of the magnitude of 25–40 V. This potential will be added to that due to a separately applied rf bias on the wafer plus that due to a dc sheath potential. The energetic electrons will preferentially self-bias insulating surfaces by charging them to an increased negative voltage. This increased potential will repel low energy electrons, of increased energy, until the incident electron current is reduced to be equal to local ion current. Conducting and semiconducting surfaces can be connected such that excess negative charges do not build up locally. For example, these surfaces could be grounded. Thus, either ion or electron imbalanced current is drained away to prevent energetic electron generated bias. High selectivity will be possible if the range of ion energies incident on semiconductor or metal is below the threshold for etching those surfaces, whereas the ion energy incident on the oxide is mostly or entirely above the threshold for etching oxide due to the oxide's self-bias.

Etch rates have been measured on silicon oxide and silicon in an ECR discharge, where the etch rate for silicon oxide was proportional to the fluorine ion energy density $J_iE_i$, if sufficient atomic fluorine was present. $J_i$ is the ion current density and $E_i$ is the ion energy at the wafer surface. The average ion energy varied between 40 and 130 eV. The maximum etch rate reached 340 nm/min at 400 mW/cm². Silicon etch rates were similar to silicon oxide at low ion energy densities, but saturated at approximately 120 nm/min at 150 mW/cm². (See "Etching Rate Characterization of $SiO_2$ and Si Using Ion Energy Flux and Atomic Fluorine Density in a $CF_4/O_2/Ar$ Electron Cyclotron Resonance Plasma", J. Ding, et al., J. Vac. Sci. Technol. A 11, pg. 1283 (1993)). This results in an increase in selectivity by a factor of two using energetic electrons from a helicon plasma source.

A typical manufacturer will introduce a gas such as a carbon fluoride as a plasma gas into the chamber in sufficient concentration to etch the oxide. The following two equations represent chemical reactions that occur:

$$CHF_3 + e^- \rightarrow CHF_2 + F \qquad (2)$$

$$CH F_3 + e^- \rightarrow CF_2 + HF \qquad (3)$$

Figure 8A:
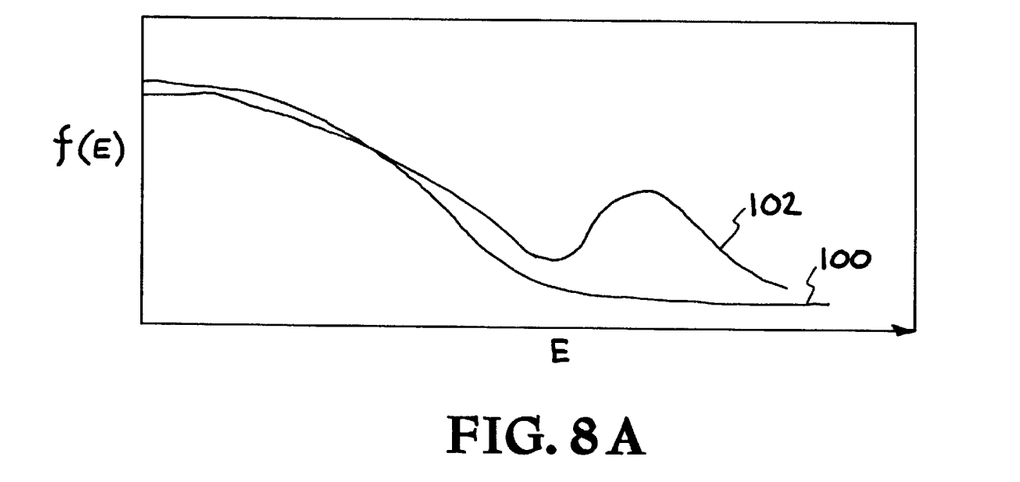
FIG. 8a is a graph showing the time-averaged electron energy distribution functions for helicon plasma.
Figure 8B:
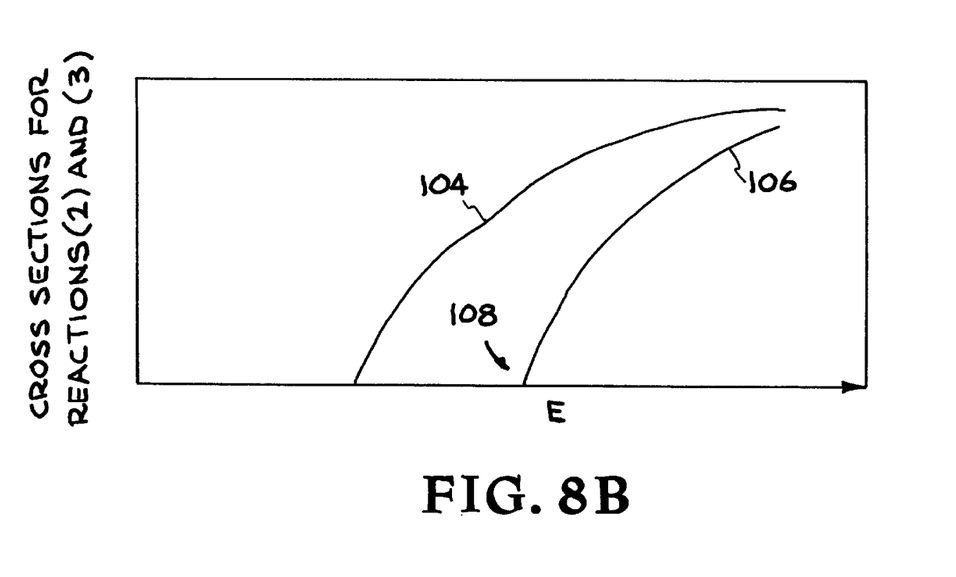
FIG. 8b is a graph showing the cross sections to drive specific chemical reactions.

FIG. 8a is a graph showing the time-averaged electron energy distribution functions (EEDF) for helicon plasma. Curve 100 is produced without hot electron formation and curve 102 is produced with hot electron formation. FIG. 8b is a graph showing the cross sections to drive the chemical reactions shown in equations (2) and (3) above. The chemical reactions in equation (3) will not occur until a minimum threshold is met at point 108. For example, if curve 104 is associated with chemical reactions in equation (2), and curve 106 is associated with chemical reactions in equation (3), then products produced by the second reaction would be enhanced by increasing the hot electron density, i.e., from curve 100 to curve 102 in FIG. 8a. Thus, the peak of curve 102 in FIG. 8A is beyond the threshold point 108 in FIG. 8b. Similarly, reducing hot electron production would favor products from the chemical reaction in equation (2) above.

When the reactions corresponding to equation (2) occur, the free fluorine atom can react with the silicon oxide molecules according to the following chemical reaction:

$$4F + SiO_2 \rightarrow SiF_4 + O_2 \qquad (4)$$

Thus, the silicon oxide is etched from the semiconductor and the gas formed can be extracted from the chamber. When the chemical reaction in equation (3) occurs, $CF_2$ radicals are produced: these radicals are believed to be responsible for polymer deposition, which protects the side-walls (preventing undercutting of the photoresist) and the underlying silicon layer. In this way, one can modify the gas-phase and ionic chemistry by controlling the hot electron production.

Etch rates have also been measured on polysilicon with a low energy ion beam, which showed a threshold of 25 eV for etching polysilicon with chlorine ions in a $10^{-4}$ Torr chlorine gas. These results are complementary rather than contradictory with those from an ECR discharge for two reasons: (a) different etchant gases were used, fluorine and chlorine, respectively; and (b) the ECR plasma etch ion energy began above the threshold energy observed with the ion beam measurement. With an energy threshold, oxide etching selectively could be enhanced by an order of magnitude.

Figure 9:
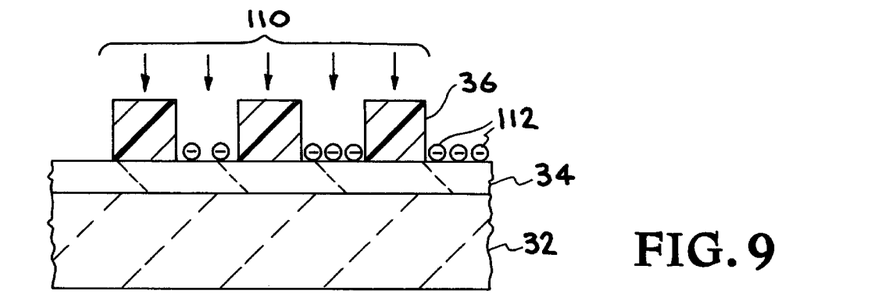
FIG. 9 shows a semiconductor that is accumulating energetic electrons during the etching process of the present invention.

Referring to FIG. 9, the semiconductor is ready to be etched. The helicon wave 110 deposits energetic electrons 112 on the surface of the silicon oxide 34. Thus, the oxide has a negative charge. The etching gas (not shown) is then applied to the semiconductor. The negative potentials will accelerate positive etchant ions to higher energy and effectiveness when incident on the oxide. Ions will be accelerated by and will bombard the negatively biased surfaces with higher energy. Since the etch rate is known to increase with ion energy, and in some cases has a threshold energy below which the etch rate is negligible, self-biased surfaces can be etched at a selectively higher rate then non-self-biased surfaces.

Figure 10:
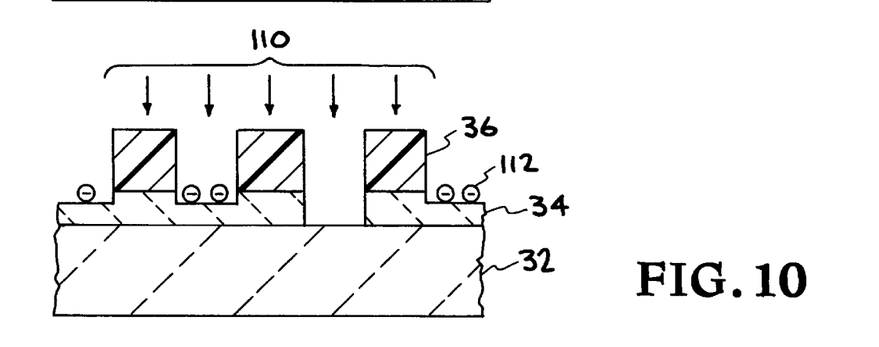
FIG. 10 shows a semiconductor with different levels of etched oxide layers during the etching process of the present invention.

In FIG. 10, the oxide has been completely removed from the substrate in one section. The energetic electrons, which are continuously being supplied by the helicon wave 110, are drained away, for example, via grounding the substrate, so that the surface potential will be less negative than the charge on the remaining oxide layers. The etch rate will therefore be selectively reduced for non-oxide areas. Thus, the erosion of the non-oxide regions is avoided.

A third preferred embodiment of the present invention will be described with reference to FIG. 11. Manufacturers are presently forming semiconductors that have several layers or levels of elements. Connections between these levels are usually made using multilevel interconnects on the semiconductor. In order to internally connect elements on different levels, the manufacturer must be able to make channels that are 0.18 μm or even less. Presently, etching channels with a diameter of only 0.18 μm in silicon and metal can be done. However, etching channels in silicon oxide can only be done to a diameter of 0.35 μm. Thus, the present invention can be used to manufacture channels in silicon oxide that are in the range of 0.18–0.35 μm. However, this procedure of using helicon plasma sources could produce even narrower channels with diameters of less than 0.18 μm.

Figure 11:
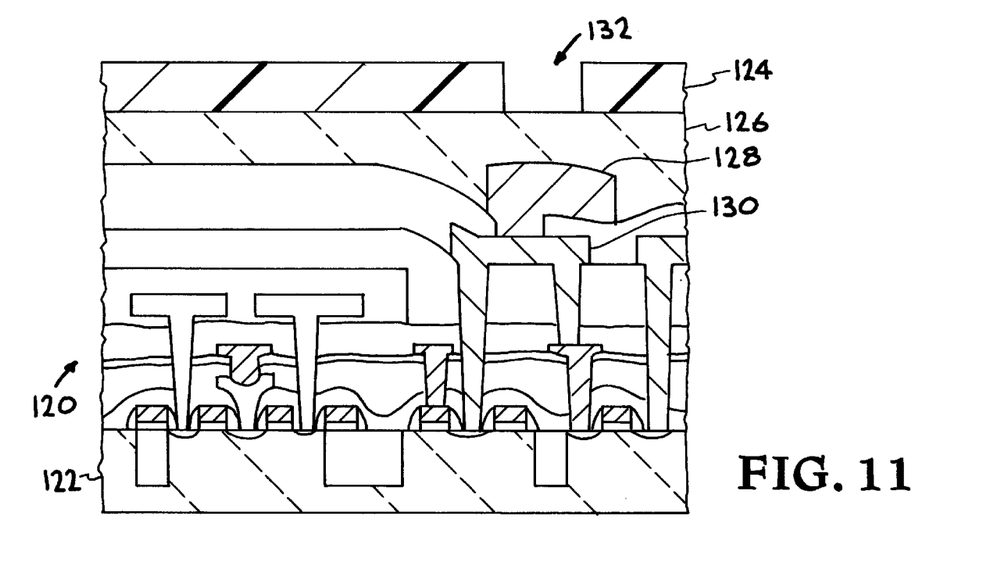
FIG. 11 is a multilevel semiconductor device with interconnects between levels using the process of the present invention.

The manufacturer could put the semiconductor 120 shown in FIG. 11 into the chamber shown in FIG. 7. Many of the steps could be performed in the same chamber by simply adjusting the magnetic field or rf power of the helicon plasma source such that energetic electrons will be supplied to the exposed surfaces of the semiconductor as it is being manufactured.

For example, if a connection to the lower level is the next step in manufacturing, then a patterned photo-resist layer 124 is formed on a layer of silicon oxide 126. Two layers of metal 128 and 130 are already deposited below the layer of oxide 126. The next step is to etch the oxide in the area 132 exposed by the photo-resist 124 until the metal layer 128 is exposed. The magnetic field around the helicon plasma source can be changed so that the energetic electrons will be produced. The plasma gas will begin to etch the exposed silicon oxide to form a narrow trench or via. Energetic electrons would charge the bottom of the oxide in the via such that the ion energy striking the oxide increases. Therefore, the etch rate for the oxide will increase. On making contact with the metal 128, the excess negative charge can be conducted off of the surface, decreasing the ion impact energy. Therefore, the etch rate of the metal 128 will decrease. If the manufacturer desired to continue the etching through the metal, the magnetic field around the helicon plasma source can be changed so that the energetic electrons will not be produced. The appropriate etching plasma can be supplied to etch the metal layer as taught by the prior art.

As the etching proceeds, the production of energetic electrons by the helicon plasma can be turned on or off by varying the axial magnetic field or rf power such that the manufacturer can quickly switch between an oxide etching state with energetic electrons to an etching state for other materials without energetic electrons. The capability of using a single tool for multiple applications could increase productivity by reducing the need, and the time required, to transfer a wafer between multiple tools. For example, exciting in an oxygen plasma after oxide etching can remove polymer buildup from the contact and sidewalls. However, high ion energies in this step would be disadvantageous; therefore the energetic electron production would be turned off.

Another distinct advantage to this process is that energetic electrons are projected in a straight line toward the oxide surface. Thus the charge on the side walls of the oxide will not accumulate as high a charge as the bottom of the oxide. This is very advantageous in multilayer semiconductors because the energetic electrons will penetrate to the bottoms of trenches and vias, with less deflection than low energy electrons. At the bottom of these trenches and vias, the energetic electrons will neutralize the ion current and maintain the full etch rate even in future generation devices where the depth greatly exceeds the width. However, the etch rate will be reduced upon breaking through an oxide layer to the silicon substrate or metal layer in multilayer semiconductors.

Although the invention has been described and illustrated with particularity, it is intended to be illustrative of preferred embodiments. It is understood that the disclosure has been made by way of example only. Numerous changes in the combination and arrangements of the parts, steps and features can be made by those skilled in the art without departing from the spirit and scope of the invention, as hereinafter claimed.

What is claimed is:

1. A process for etching an insulator formed on a non-insulator surface comprising the steps of:
adjusting a magnetic field of a helicon plasma source between a first level to generate a small amount of energetic electrons that fail to significantly charge an exposed surface of said insulator and a second level to generate a large amount of energetic electrons that charge said exposed surface of said insulator, wherein said magnetic field is maintained at said first level or said second level; and
forming an ionic plasma that etches said exposed charged surface of said insulator.

2. The process of claim 1, wherein said helicon plasma source comprises:
a plasma tube having a first end capped;
an antenna surrounding an exterior of said plasma tube and powered by an rf power source, said antenna forming a helicon wave within said plasma that is emitted from a second end of said plasma tube;
axial solenoidal windings surrounding said antenna and said plasma tube, said axial solenoidal windings producing magnetic fields within said plasma; and
a controller for adjusting said magnetic fields between said first level and said second level.

3. The process of claim 2, wherein a second controller adjusts said rf power supplied to said antenna such that said amount of said energetic electrons is further increased or decreased.

4. The process of claim 1, wherein said non-insulator is one of a substrate, a metal, a semiconducting material and a silicon wafer.

5. The process of claim 4, wherein said non-insulator layer is connected such that excess negative charges fail to accumulate, but said exposed insulator layer remains charged.

6. The process of claim 1, wherein said insulator is one of an oxide or a silicon oxide.

7. The process of claim 1, wherein said exposed surface is formed by forming a pattern layer comprised of one of a cured photo-resist, a metal, a chromium and a silicon.

8. The process of claim 1, wherein a width of a channel formed between two adjacent insulator layers remaining after etching is less than 0.35 $\mu$m.

9. The process of claim 1, wherein said ionic plasma is at least one of fluorine, chlorine and bromine.

10. The process of claim 1, wherein said process is used to form a thin-film device.

11. The helicon plasma source for controlling with control of the production of energetic electron currents carried by a helicon wave comprising:
a plasma tube having a first end capped;
an antenna surrounding an exterior of said plasma tube and powered by an rf power source, said antenna forming said helicon wave within said plasma such that said helicon wave is emitted from a second end of said plasma tube;
axial solenoidal windings surrounding said antenna and said plasma tube, said axial solenoidal windings producing magnetic fields within said plasma; and
means for adjusting said magnetic fields between a first level that produces a negligible energetic electron current and a second level that produces a large energetic electron current, wherein said magnetic fields are maintained at said first level or said second level.

12. The helicon plasma source of claim 11, further comprising means for adjusting said rf power supplied to said antenna such that said large energetic electron current can be increased or decreased.

13. An apparatus for manufacturing a thin-film device comprising:
a chamber;
a helicon plasma source producing a helicon wave in said chamber, said helicon wave being projected toward said thin-film device;
a first controller adjusting magnetic fields in said helicon plasma source between a first level that produces a negligible energetic electron current carried by said helicon wave and a second level that produces a large energetic electron current, wherein said magnetic fields are maintained at said first level or said second level;
a platform for holding said thin-film device; and
a second controller for controlling a concentration of etching plasma in said chamber.

14. The apparatus of claim 13 further comprising a third controller for adjusting an rf power supplied to an antenna of said helicon plasma source such that said energetic electron current is further controlled.

15. The apparatus of claim 13, wherein multiple etching steps can be performed in said chamber without moving said thin-film device by increasing or decreasing said energetic electron and said concentration of etching plasma.

16. The apparatus of claim 13, wherein energetic electrons in said energetic electron currents penetrate to a bottom of a channel formed during etching of said thin-film device.

17. A process for etching an insulator formed on a non-insulator surface comprising the steps of:
adjusting an rf power supplied to an antenna of a helicon plasma source between a first level that produces a small amount of energetic electrons that fail to significantly charge an exposed surface of said insulator and a second level to generate a large amount of energetic electrons that charge said exposed surface of said insulator, wherein said rf power supplied to said antenna is maintained at said first level or said second level; and
forming an ionic plasma that etches said exposed charged surface of said insulator.

18. The process of claim 17, wherein said helicon plasma source comprises:
a plasma tube having a first end capped;
said antenna surrounding an exterior of said plasma tube and powered by said rf power source, said antenna producing a helicon wave within said plasma that is emitted from a second end of said plasma tube; and
axial solenoidal windings surrounding said antenna and said plasma tube, said axial solenoidal windings producing magnetic fields within said plasma; and
a controller adjusting said rf power source between said first level and said second level.

19. The process of claim 17, wherein said non-insulator is one of a substrate, a metal, a semiconducting material and a silicon wafer.

20. The process of claim 19, wherein said non-insulator layer is connected such that excess negative charges fail to accumulate, but said exposed insulator layer remains charged.

21. A process of claim 20, wherein said insulator is one of an oxide or a silicon oxide.

22. The process of claim 17, wherein said exposed surface is formed by forming a pattern layer comprised of one of a cured photo-resist, a metal, a chromium and a silicon.

23. A process of claim 17, wherein a width of a channel formed between two adjacent insulator layers remaining after etching is less than 0.35 $\mu$m.

24. A process of claim 17, wherein said ionic plasma is at least one of fluorine, chlorine and bromine.

25. The process of claim 17, wherein said process is used to form a thin-film device.

26. A helicon plasma source with control of the production of energetic electron currents carried by a helicon wave comprising:

a plasma tube having a first end capped;

an antenna surrounding an exterior of said plasma tube and powered by an rf power source, said antenna forming said helicon wave within said plasma such that said helicon wave is emitted from a second end of said plasma tube;

axial solenoidal windings surrounding said antenna and said plasma tube, said axial solenoidal windings producing magnetic fields within said plasma; and a controller for adjusting said magnetic fields between a first level that produces a negligible energetic electron current and a second level that produces a large energetic electron current, wherein said magnetic fields are maintained said first level or said second level.

27. The helicon plasma source of claim 26 further comprising a second controller that adjusts said rf power supplied to said antenna such that said large energetic electron current can be increased and decreased.

28. The helicon plasma source of claim 26, wherein said magnetic field at said first level is approximately 100 Gauss and said magnetic field at said second level is approximately 80 Gauss.

29. A helicon plasma source with control of the production of energetic electron currents carried by a helicon wave comprising:

a plasma tube having a first end capped;

an antenna surrounding an exterior of said plasma tube and powered by an rf power source, said antenna forming said helicon wave within said plasma such that said helicon wave is emitted from a second end of said plasma tube;

axial solenoidal windings surrounding said antenna and said plasma tube, said axial solenoidal windings producing magnetic fields within said plasma; and a controller for adjusting an rf power of said rf power source between a first level that produces a negligible energetic electron current and a second level that produces a large energetic electron current, wherein said rf power is maintained at said first level or said second level.

30. The helicon plasma source of claim 29, wherein said rf power at said first level is approximately 3 kW and said rf power at said second level is approximately 5 kW.

* * * * *